United States Patent [19]
Makino et al.

[11] Patent Number: 5,570,047
[45] Date of Patent: Oct. 29, 1996

[54] SEMICONDUCTOR INTEGRATED CIRCUIT WITH SENSE AMPLIFIER CONTROL CIRCUIT

[75] Inventors: Eiichi Makino; Masaru Koyanagi; Kazuyoshi Muraoka, all of Yokohama, Japan

[73] Assignee: Kabushiki Kaisha Toshiba, Tokyo, Japan

[21] Appl. No.: 298,837

[22] Filed: Aug. 31, 1994

[30] Foreign Application Priority Data

Sep. 7, 1993 [JP] Japan .................... 5-221959

[51] Int. Cl.$^6$ .................... H03K 5/153; G11C 7/00
[52] U.S. Cl. .................... 327/80; 327/68; 327/530; 365/189.09
[58] Field of Search .................... 327/50, 51, 60, 327/62, 68, 72, 74, 77–81, 88, 530; 365/189.06, 189.07, 189.09

[56] References Cited

U.S. PATENT DOCUMENTS

| | | | |
|---|---|---|---|
| 3,702,943 | 11/1972 | Heuner et al. | 327/81 |
| 4,321,489 | 3/1982 | Higuchi et al. | 327/78 |
| 4,810,907 | 3/1989 | Tohyama | 327/80 |
| 5,041,893 | 8/1991 | Nagai et al. | 327/80 |
| 5,170,077 | 12/1992 | Schreck | 327/80 |
| 5,204,550 | 4/1993 | Jungert | 327/78 |
| 5,253,201 | 10/1993 | Atsumi et al. | 365/189.06 |
| 5,420,798 | 5/1995 | Lin et al. | 365/189.09 |

*Primary Examiner*—Timothy P. Callahan
*Assistant Examiner*—T. Lam
*Attorney, Agent, or Firm*—Loeb & Loeb LLP

[57] ABSTRACT

A semiconductor integrated circuit includes memory cell blocks having memory cells arranged in matrix, sense amplifiers, each located adjacent to the memory cells, and sense amplifier control circuits, each of the sense amplifier control circuit being located on outside of the memory cell block. The sense amplifier control circuit has a standard voltage generating circuit and a control circuit for receiving the standard voltage and for transferring a driver signal to the sense amplifier to control the charging ability of the sense amplifier. The source voltage has three voltage regions, first, intermediate, and second regions. In the first voltage region, the potential of the driver signal increases with the increase of the source voltage. In the intermediate voltage region (2.7 to 3 Volt), the potential of the driver signal is changed oppose to the change of the source voltage, and in the second voltage region, the potential of the driver signal decreases with the increase of the source voltage.

22 Claims, 7 Drawing Sheets

SEMICONDUCTOR INTEGRATED CIRCUIT WITH SENSE AMPLIFIER CONTROL CIRCUIT

BACKGROUND OF THE INVENTION

1. Field of the Invention

The present invention relates to a semiconductor integrated circuit with a sense amplifier control circuit for controlling the operation of a sense amplifier (or a charge supplying circuit) incorporated in a semiconductor integrated circuit such as a semiconductor integrated memory device, in particular, to a sense amplifier control circuit in a semiconductor integrated circuit capable of preventing a lowering of the operating margin caused in a charge operation of a sense amplifier when different external source voltage is used.

2. Description of the Prior Art

Conventionally, it is difficult to keep the same source charging characteristics suitable for both low voltage operations (for example, $V_{CC}$=3.3 V) and high voltage operations (for example, $V_{CC}$=5.0 V) in a same integrated circuit for a sense amplifier (or a P-channel sense amplifier) consisting of a P-channel MOS transistor.

When a high voltage is used as the source voltage, the driving ability of the transistor is increased, therefore the driving ability of a drive circuit for driving a P-channel sense amplifier is also increased so that the P-channel sense amplifier is charged at a high speed rate. In such a case, a particular problem is a charging noise which occurs when the P-channel sense amplifier is charged. An extremely large charging noise produces serious problems, such as causing errors in the circuit operation.

In addition, because of the recent trend to an increasing number of bits in highly integrated circuits, as exemplified in dynamic RAMs, the number of sense amplifiers driven at one time is increased, and the effect of more and more charging noise becomes serious.

When a low voltage is used as the source voltage, the drive ability of the transistor is decreased, and the rate of charging the P-channel sense amplifier becomes slow. In a dynamic RAM, the problem is produced that when the cycle timing is delayed, the timing for restoring cell data is also delayed. Accordingly, it is preferable that the driving ability of a sense amplifier control circuit 21 (or a sense amplifier control means) for driving a P-channel sense amplifier (a charge supplying circuit) be increased on the use of the low source voltage as compared with the use of the high source voltage. However, it is difficult to obtain such characteristics with conventional semiconductor integrated circuits.

Figure 1:
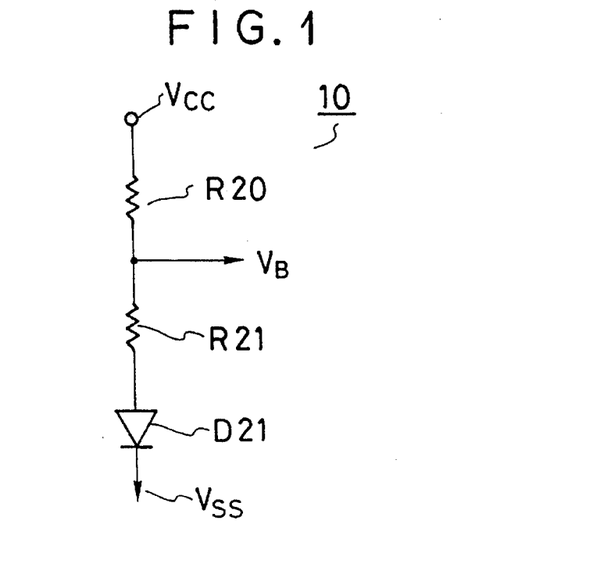
FIG. 1 is a configuration drawing of a standard voltage generating circuit used as a charging circuit for a conventional P-channel type sense amplifier (or a charge supplying circuit).
Figure 2:
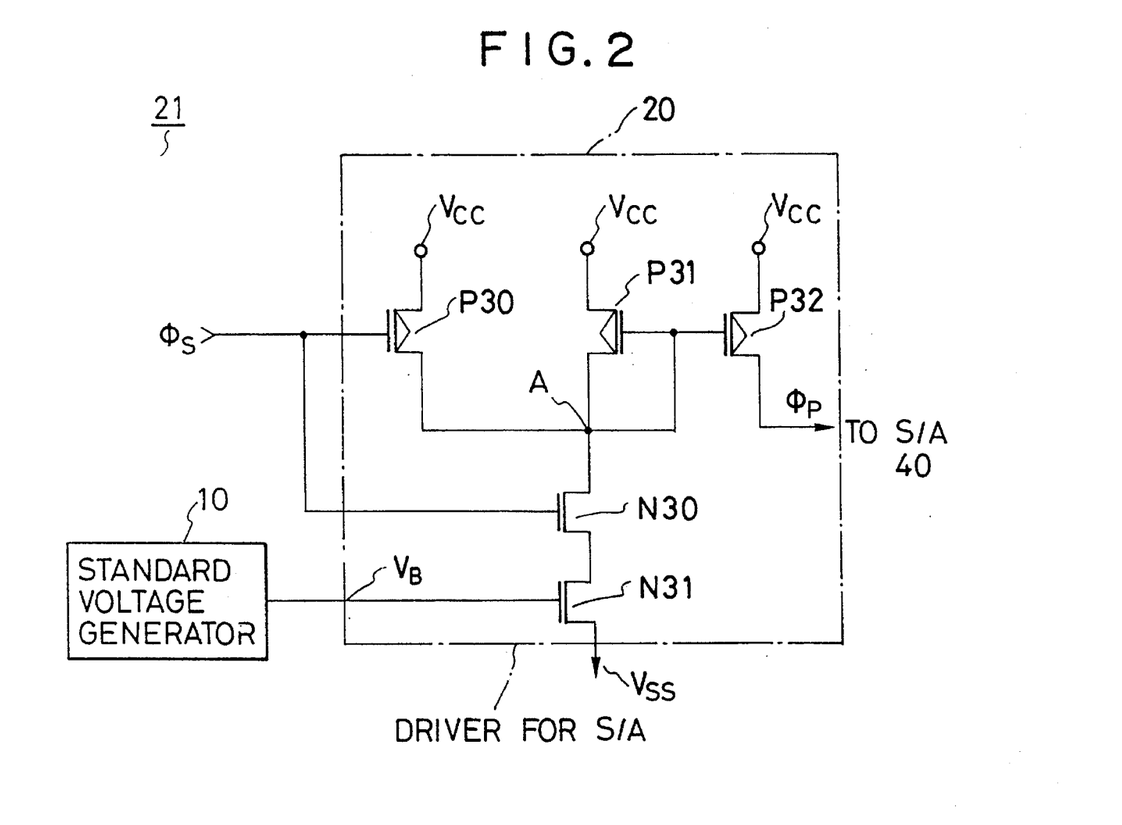
FIG. 2 is a circuit diagram of a sense amplifier control circuit for controlling a sense amplifier operation, which consists of the conventional standard generating circuit and a drive circuit for the sense amplifier.
Figure 3:
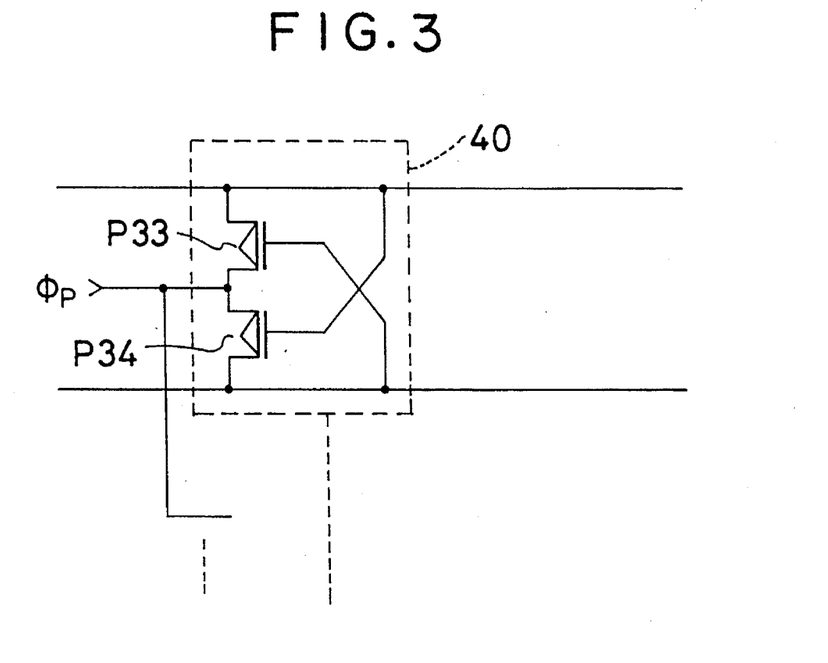
FIG. 3 is a circuit diagram of a sense amplifier controlled by the control signal φP from the sense amplifier control circuit shown in FIG. 2.

FIG. 1 shows a circuit diagram of a standard voltage generation circuit 10 or a standard voltage generator 10 as a charging circuit, whose outputs is provided to a driving circuit or a driver 20 shown in FIG. 2 for a conventional P-channel type sense amplifier 40 (a charge supplying circuit) shown in FIG. 3 in a conventional semiconductor integrated circuit.

In this section, the circuit which consists of the standard voltage generating circuit 10 and the drive circuit 20 is called a sense amplifier control circuit 21 for the sense amplifier 40.

In FIG. 1, the standard voltage generating circuit 10 has a configuration in which a resistance R20 of which one end is connected to a source voltage $V_{CC}$, a resistance R21 connected in series with the resistance R20, and a diode D21 of which the anode is connected to the resistance R21, and the cathode of the diode 21 is connected to a ground potential $V_{SS}$. The standard voltage $V_B$ supplied from the standard voltage generation circuit 10 is provided at an intermediate node between the resistance R20 and the resistance R21.

As shown in FIG. 2, the standard voltage $V_B$ generated by the standard voltage generating circuit 10 is supplied to the drive circuit 20 (or the driver) for a P channel type sense amplifier 40 shown in FIG. 3.

In the drive circuit 20 shown in FIG. 2, when an activation signal φS for a P-channel sense amplifier 40 is at the L level, an N-channel transistor N30 is in the cut-off state and a P-channel transistor P30 is in the ON state. Accordingly, the gate voltage of P-channel transistors P31 and P32 is $V_{CC}$ and the transistors P31 and P32 are cut off so that no charge is supplied to a sense amplifier drive signal φP (floating state) as the output of the driving circuit 20.

Next, when the activation signal φS is switched from the L level to the high level, the P-channel transistor P30 is cut off and the N-channel transistor N30 is turned ON. Here, the voltage potential of a node A can be controlled based on changing the conductance of a transistor N31 by regulating the value of the gate voltage $V_B$ of the N-channel transistor N31.

In this manner, the voltage potential of the node A in the drive circuit 20 is controlled by adjusting the standard voltage $V_B$. As a result, the charging ability of the P-channel sense amplifier 40 is varied by changing the conductance of the transistor P32 for driving the P-channel sense amplifier 40. For example, when the standard voltage $V_B$ is increased, the potential of the node A in the drive circuit 20 is decreased, and the conductance of the transistor P32 for driving the P-channel sense amplifier 40 is increased. Specifically, the charging ability is increased.

FIG. 3 shows the circuit diagram for the P-channel sense amplifier 40. The sense amplifier drive signal φP is provided to the source of P-channel transistors P33 and P34.

Figure 4:
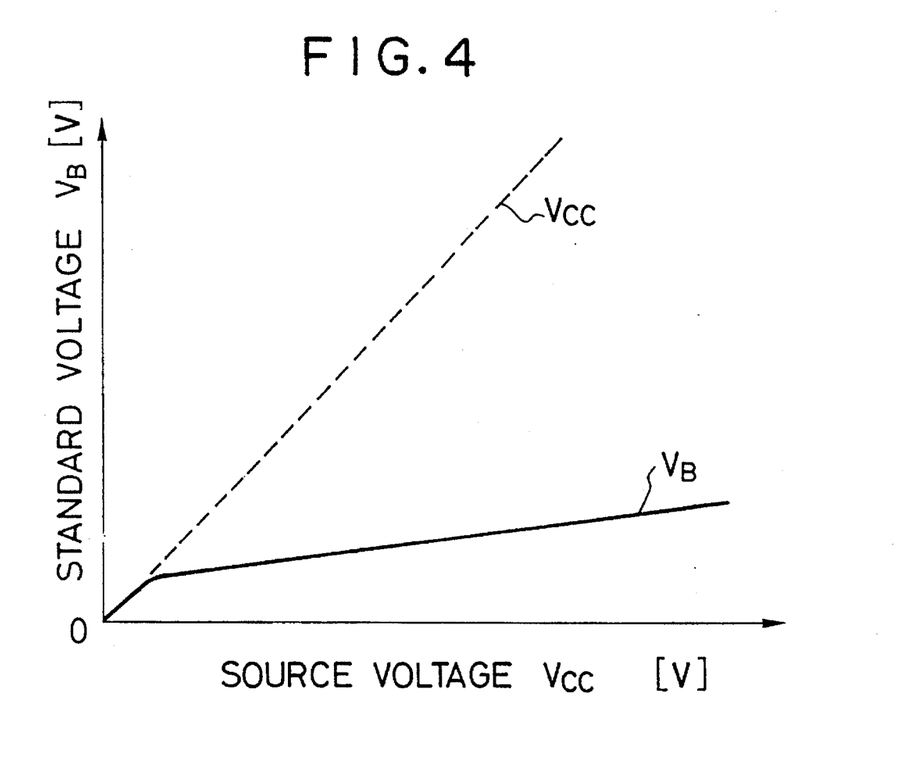
FIG. 4 is a diagram showing the characteristics of a standard voltage $V_B$ with respect to a source voltage $V_{CC}$ for the conventional sense amplifier control circuit shown in FIG. 2.

FIG. 4 is a diagram showing the changes in the standard voltage $V_B$ with respect to the source voltage $V_{CC}$ for the sense amplifier control circuit 21 consisting of the standard voltage generating circuit 10 and the drive circuit 20. When the source voltage $V_{CC}$ rises, the standard voltage $V_B$ has the same level as the source voltage $V_{CC}$ until $V_B$ reaches the threshold voltage of the diode D21. When the standard voltage $V_B$ is exceed to the threshold voltage of the diode D21, following the source voltage, the standard voltage $V_B$ rises in proportion to the ratio of the resistances R20 and R21.

In this example of a conventional circuit, the charging velocity is retarded on the low source voltage side and is higher on the high source voltage side because the standard voltage $V_B$ rises in proportion to the source voltage $V_{CC}$. For this reason, the delay in the cycle timing and the like is large on the low voltage side and the operating margin drops on the high voltage side because this acts to increase the charging noise.

Accordingly, it is difficult to obtain charging characteristics for the P-channel sense amplifier 40 suitable for both low voltage periods and high voltage periods in the same integrated circuit using the standard voltage generating circuit 10 shown in FIG. 1 with these characteristics.

Specifically, the low voltage side of the standard voltage $V_B$ rises following the source voltage $V_{CC}$ (almost the same voltage potential), but it is desired to obtain the type of characteristics where the level of the standard voltage $V_B$ gradually drops when reaching the desired source voltage.

As outlined above, it is difficult to obtain the charging characteristics of a suitable sense amplifier when a low source voltage is used or a high source voltage is used in a same semiconductor integrated circuit because the standard voltage used for driving the sense amplifier rises, acting in the direction in which the operating margin drops, in proportion to the source voltage.

SUMMARY OF THE INVENTION

Accordingly, an object of the present invention is, with due consideration to the drawbacks of such conventional sense amplifier control circuit incorporated in a semiconductor integrated circuit, to provide a semiconductor integrated circuit which prevents a lowering of the operating margin caused by charging the sense amplifier (or the charge supply circuit) by controlling the drive ability thereof in reverse dependence on the source voltage, even when an external source voltage varies for the same semiconductor integrated circuit.

In accordance with one aspect of the present invention, there is provided a semiconductor integrated circuit comprising:

a plurality of memory cell blocks, each comprising a plurality of memory cells arranged in rows and columns;

a plurality of sense amplifiers, each located adjacent to the memory cells; and a plurality of sense amplifier control circuit, each of the sense amplifier control circuit being located on outside of the memory cell block, each sense amplifier control circuit comprising:
the standard voltage generating circuit comprising:
a first circuit comprising: a first resistance, a N-channel MOS transistor, a second resistance, and a diode being connected in series, wherein the first resistance being connected to a power source and the diode being connected to a ground; and
a second circuit comprising: a P-channel MOS transistor, a third resistance, and a fourth resistance being connected in series, wherein the P-channel MOS transistor being connected to the power source, the fourth resistance being connected to the ground, and an intermediate point (or intermediate point) between the P-channel MOS transistor and the third resistance being connected to a gate of the P-channel MOS transistor,
wherein an intermediate point between the third resistance and the fourth resistance is connected to a gate of the N-channel MOS transistor, and output of the standard voltage generating circuit is supplied to an intermediate point between the first resistance and the N-channel MOS transistor, and
control circuit for receiving the standard voltage provided from the standard voltage generating circuit and for transferring a driver signal to the sense amplifier to control the charging ability of the sense amplifier, wherein the source voltage has three voltage regions, first, intermediate, and second regions, in the first voltage region, the potential of the driver signal increases with the increase of the source voltage, in the intermediate voltage region, the potential of the driver signal is changed oppose to the change of the source voltage, and in the second voltage region, the potential of the driver signal decreases with the increase of the source voltage.

In accordance with another aspect of the present invention, there is provided a semiconductor integrated circuit comprising:

a plurality of memory cell blocks, each comprising a plurality of memory cells arranged in rows and columns;

a plurality of sense amplifier means, each located adjacent to the memory cells; and a plurality of sense amplifier control circuit, each of the sense amplifier control circuit being located on outside of the memory cell block, each sense amplifier control circuit comprising:
a first resistance, a second resistance, a N-channel MOS transistor, a third resistance, and a diode being connected in series,
wherein an intermediate point between the first resistance and the second resistance is connected to a gate of the N-channel MOS transistor, and output of the standard voltage generating circuit is supplied to an intermediate point between the second resistance and the N-channel MOS transistor, and
control circuit for receiving the standard voltage provided from the standard voltage generating circuit and for transferring a driver signal to the sense amplifier to control the charging ability of the sense amplifier, wherein the source voltage has three voltage regions, first, intermediate, and second regions, in the first voltage region, the potential of the driver signal increases with the increase of the source voltage, in the intermediate voltage region, the potential of the driver signal is changed oppose to the change of the source voltage, and in the second voltage region, the potential of the driver signal decreases with the increase of the source voltage.

In the semiconductor integrated circuit above, the control circuit is made up of a current mirror circuit.

In the semiconductor integrated circuit above, the range of the intermediate voltage region is from 2.7 volt to 3 volt.

In the semiconductor integrated circuit above, the number of the memory cell blocks is four.

In the semiconductor integrated circuit above, the memory cells and the sense amplifier circuits are incorporated in a one-to-one correspondence.

In the semiconductor integrated circuit above, each memory cell block has a row decoder incorporated between adjacent memory cell block, and the sense amplifier control circuits are incorporated at outside of each memory cell block and on opposite end to each row decoder.

In the semiconductor integrated circuit above, each of the sense amplifier control circuits is incorporated corresponding to each column of the memory cells.

In accordance with another aspect of the present invention, there is provided a semiconductor integrated circuit comprising:

a plurality of memory cell blocks, each comprising a plurality of memory cells arranged in rows and columns;

a plurality of sense amplifier means, each located adjacent to the memory cells; and a plurality of sense amplifier control means, each of the sense amplifier control means being located on outside of the memory cell block, each sense amplifier control means comprising:
standard voltage generating means; and
control means for receiving the standard voltage provided from the standard voltage generating means and for transferring a driver signal to the sense amplifier to control the charging ability of the sense amplifier, wherein the source voltage has three voltage regions, first, intermediate, and second regions, in the first voltage region, the potential of the driver signal increases with the increase of the source voltage, in the intermediate voltage region, the potential of the driver signal is changed oppose to the change of the source voltage, and in the second voltage region, the potential of the driver signal decreases with the increase of the source voltage.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Other features of this invention will become apparent in the course of the following description of exemplary embodiments which are given for illustration of the invention and are not intended to be limiting thereof. Embodiments of the present invention will now be explained with reference to the drawings.

FIRST EMBODIMENT

Figure 5:
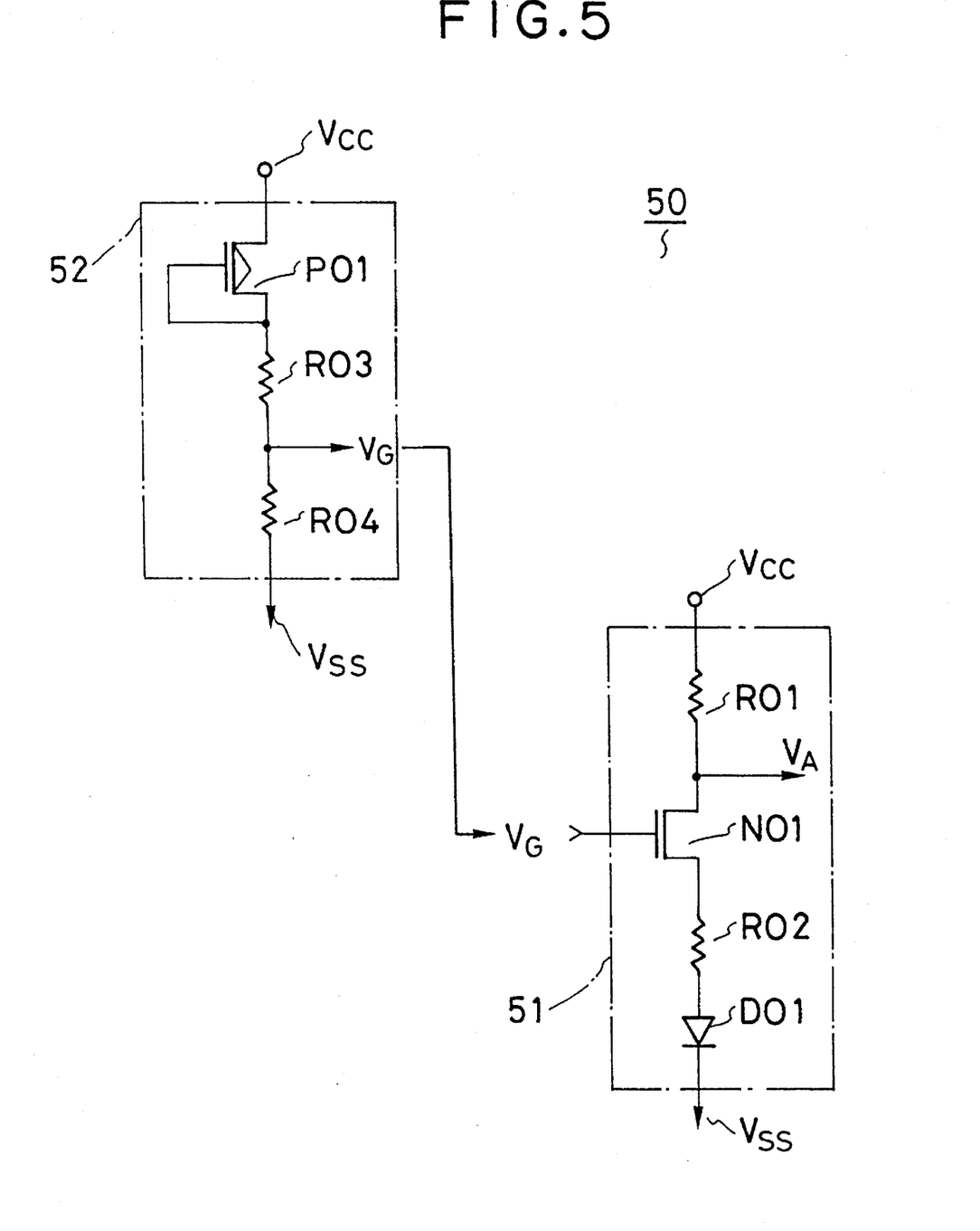
FIG. 5 is a circuit diagram of a standard voltage generating circuit incorporated in a sense amplifier control circuit shown in FIG. 6, as a first embodiment of a semiconductor integrated circuit according to the present invention, providing output voltages $V_G$ or $V_A$ to the drive circuit 20 shown in FIG. 6.
Figure 6:
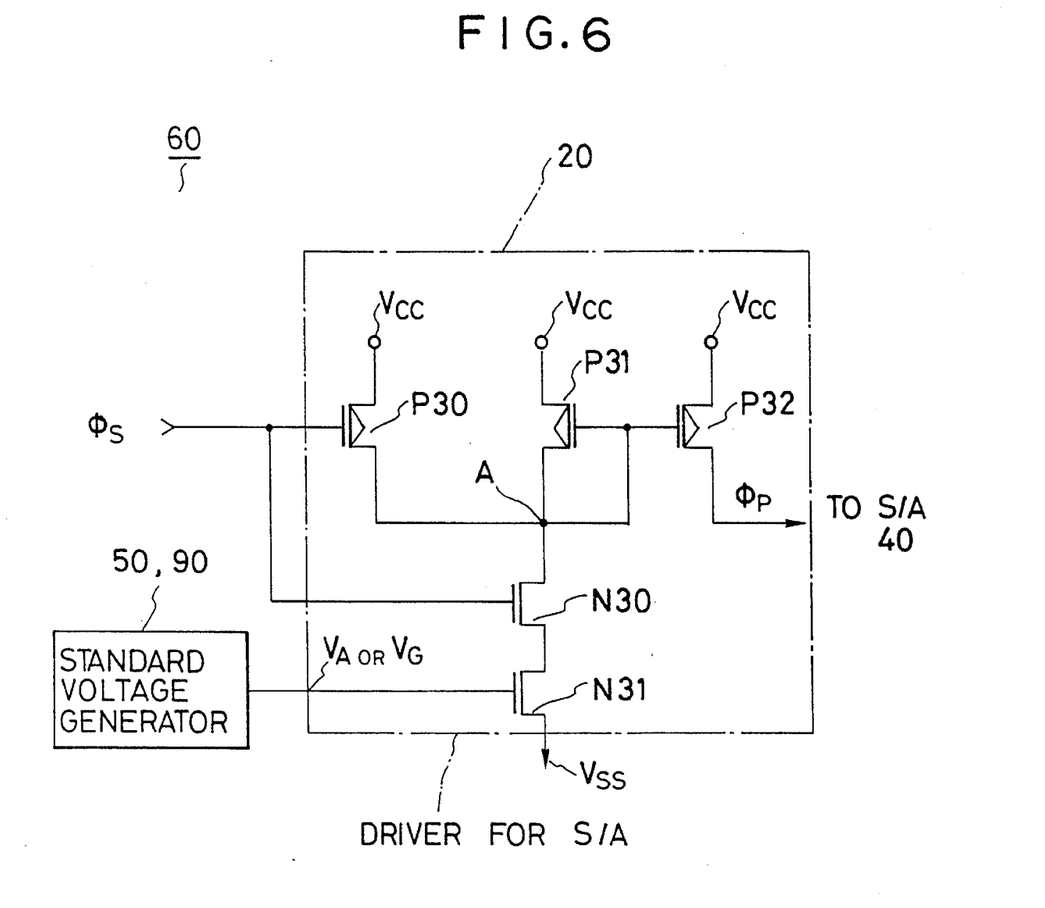
FIG. 6 is a circuit diagram of a sense amplifier control circuit 60 for a sense amplifier (or a charge supplying circuit), which consists of the standard voltage generating circuit 50 shown in FIG. 5 and the drive circuit 20.

FIG. 5 is a circuit diagram of a standard voltage generating circuit 50 (or a charge supplying circuit to a sense amplifier) incorporated in a sense amplifier control circuit 60 shown in FIG. 6 of a semiconductor integrated circuit as a first embodiment according to the present invention.

In the same manner as in the conventional example, this circuit 50 is connected to the drive circuit 20 in the sense amplifier control circuit for a sense amplifier (or a charge supplying circuit) shown in FIG. 6.

In FIG. 6, the drive circuit 20 (or a driver) in the sense amplifier control means generates a sense amplifier drive signal φP for driving the source of P-channel MOS transistors P33 and P34 for the sense amplifier 40 (or the charge supplying circuit) illustrated in FIG. 3.

The standard voltage generating circuit 50 of the first embodiment consists of two partial circuits 51 and 52. In the circuit 51, resistances R01 and R02, an N-channel MOS transistor N01, and a diode D01 are provided. In addition, in the circuit 52, resistances R03 and R04, and a P-channel MOS transistor P01 are provided.

First, in the circuit 51, the resistance R01 of which one end is connected to the source voltage $V_{CC}$, and the drain of the N-channel MOS transistor N01 is connected to the other end of the resistance R01. The resistance R02 is connected to the source of the N-channel transistor N01, the anode of the diode D01 is connected to the other end of the resistance R02, and the ground potential is connected to the cathode of the diode D01.

The standard voltage $V_A$ is provided from a connection node of the resistance R01 and the N-channel MOS transistor N01.

In addition, an output voltage $V_G$ from the circuit 52 is provided to the gate voltage of the N-channel MOS transistor N01.

In the circuit 52, the source voltage $V_{CC}$ is connected to the source of the P-channel MOS transistor P01. The drain and the gate are shorted and connected to the resistance R03. The resistance R04 is connected between the ground potential $V_{SS}$ and the resistance R03 in series.

FIG. 6 is a circuit diagram of the sense amplifier control circuit showing the connection between the standard voltage generating circuit 50, as shown in FIG. 5, and the drive circuit 20 in the sense amplifier control means 60. The sense amplifier control circuit 60 is made up of a current mirror circuit.

Figure 7:
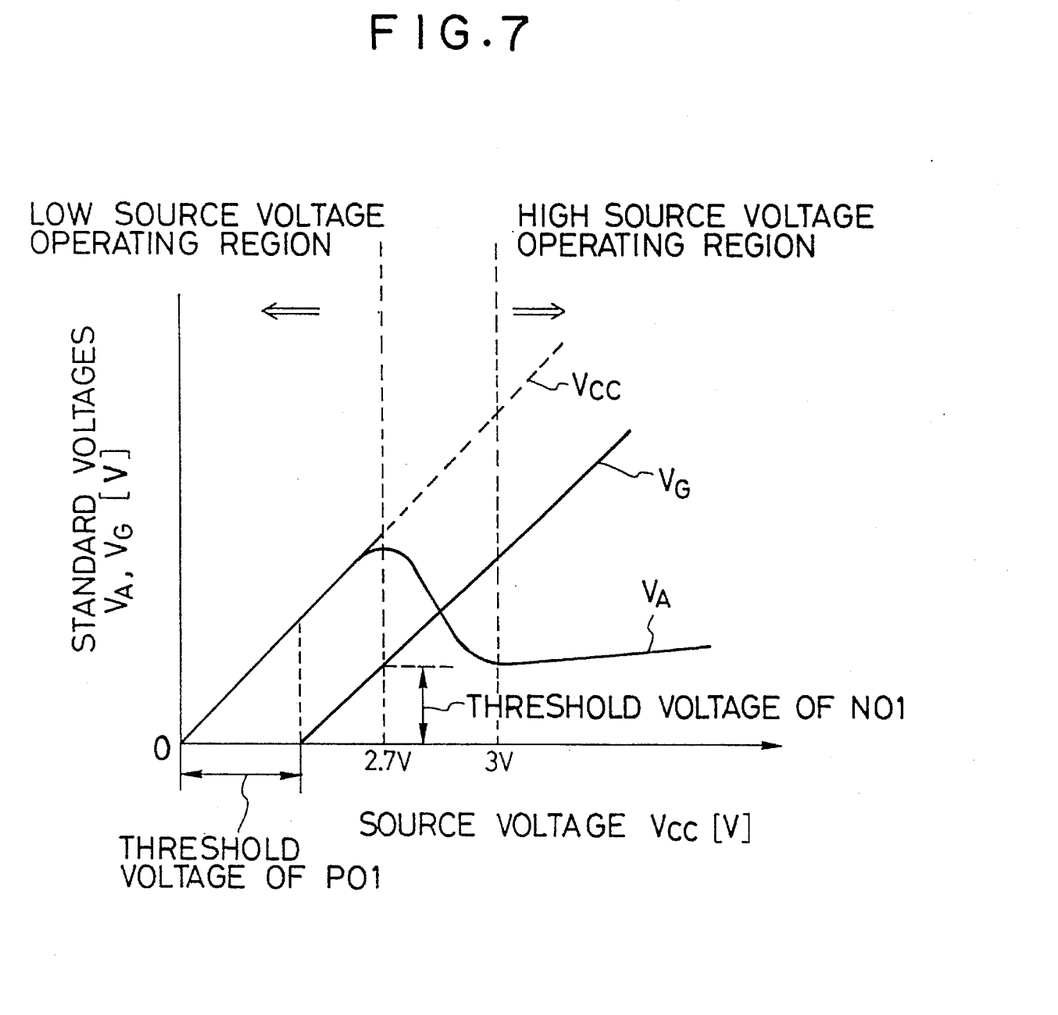
FIG. 7 is a diagram showing the characteristics of an output voltage $V_G$ and a standard voltage $V_A$ as outputs of the standard voltage generating circuit 50 shown in FIG. 5 with respect to a source voltage $V_{CC}$ in the sense amplifier control means 60 as a charge supplying circuit) shown in FIG. 6.

The characteristics of the output voltage $V_G$ and the standard voltage $V_A$ with respect to the source voltage $V_{CC}$ are shown in FIG. 7.

Considering the dependence on the source voltage $V_{CC}$ of the output voltage $V_G$ of the circuit 52 shown in FIG. 5, in the case where the source voltage $V_{CC}$ is lower than the threshold voltage of the P-channel MOS transistor P01 (in a low source voltage operating region), the output voltage $V_G$ is equal to the ground potential $V_{SS}$ because the P-channel MOS transistor P01 is cut off.

When the source voltage $V_{CC}$ is higher than the threshold voltage of the P-channel MOS transistor P01 (in a high source voltage operating region), the output voltage $V_G$ increases in proportion to the source voltage $V_{CC}$ by the divided voltage ratio (resistance ratio) of the resistances R03 and R04 because the P-channel MOS transistor P01 turns ON and starts conducting.

Next, the dependence on the source voltage $V_{CC}$ of the standard voltage $V_A$ will be considered.

In the case where the gate voltage $V_G$ of the N-channel MOS transistor N01 is lower than the threshold voltage of the N-channel MOS transistor N01, the standard voltage $V_A$ is equal to the source voltage $V_{CC}$ because the N-channel MOS transistor N01 is cut off.

When the gate voltage $V_G$ of the N-channel MOS transistor N01 is higher than the threshold voltage of the N-channel MOS transistor N01, the N-channel MOS transistor N01 turns ON and starts conducting, and, in the case where the source voltage $V_{CC}$ is above the threshold voltage of the P-channel MOS transistor P01, the gate voltage of the N-channel MOS transistor N01 changes gradually in proportion to the source voltage $V_{CC}$.

For this reason, the conductance of the N-channel MOS transistor N01 gradually increases near the threshold voltage of the N-channel MOS transistor N01. Specifically, for this reason, near the threshold voltage of the N-channel MOS transistor N01 the standard voltage $V_A$ changes according to the ratio of the sum of the ON resistance of the N-channel MOS transistor N01 and the resistance R02 to the resistance R01.

The ON resistance of the N-channel MOS transistor N01 gradually diminishes as the gate voltage $V_G$ increases, the N-channel MOS transistor N01 reaches the completely ON state, and the standard voltage $V_A$ actually decreases gradually until a uniform ON resistance is shown.

When the source voltage $V_{CC}$ is high, and if the ON resistance of the N-channel MOS transistor N01 compared to the resistances R01 and R02 is small enough to be ignored, the standard voltage $V_A$ is determined according to the threshold voltage of the diode D01 and the ratio of the resistance R02 to the resistance R01, in the same manner as for the conventional standard voltage generating circuit. As outlined in the foregoing, in the first embodiment, almost the same value is obtained for the standard voltage $V_A$ as the source voltage $V_{CC}$ on the side where the source voltage $V_{CC}$ is low (for example, not more than 2.7 Volt). In addition, the standard voltage $V_A$ is held to a low level in comparison with the low voltage side at a high voltage side (for example, not less than 3 Volt) which is higher than the desired voltage.

Specifically, there are two characteristics corresponding to the value of the source voltage $V_{CC}$.

Specifically, when the source voltage $V_{CC}$ is in the low voltage operating region (for example, not more than 2.7 Volt shown in FIG. 7), because $V_A$ is high (which is the standard voltage of the drive circuit for the P-channel sense amplifier 40 shown in FIG. 3), the charging velocity of the P-channel sense amplifier 40 therefore shows an increasing tendency, and the charging velocity of the P-channel sense amplifier 40 is retarded to a remarkable degree on the low voltage operating region. In a dynamic RAM (DRAM), for example, the cycle time is reduced by reducing the restoration time of cell data.

When the source voltage $V_{CC}$ is in the high voltage operating region (for example, not less than 3 Volt shown in FIG. 7), the charging velocity of the P-channel sense amplifier 40 is suppressed, and, in particular, it is possible to reduce erroneous operation and the like resulting from charging noise, which becomes a major problem on the high voltage operating region.

Also, with respect to the problem of a point of non-continuity when switching between the low voltage operating region and the high voltage operating region, the standard voltage $V_A$ does not change steeply, and because the change is actually gradual, it reaches a level where the effect on the operation can be ignored.

Figure 8:
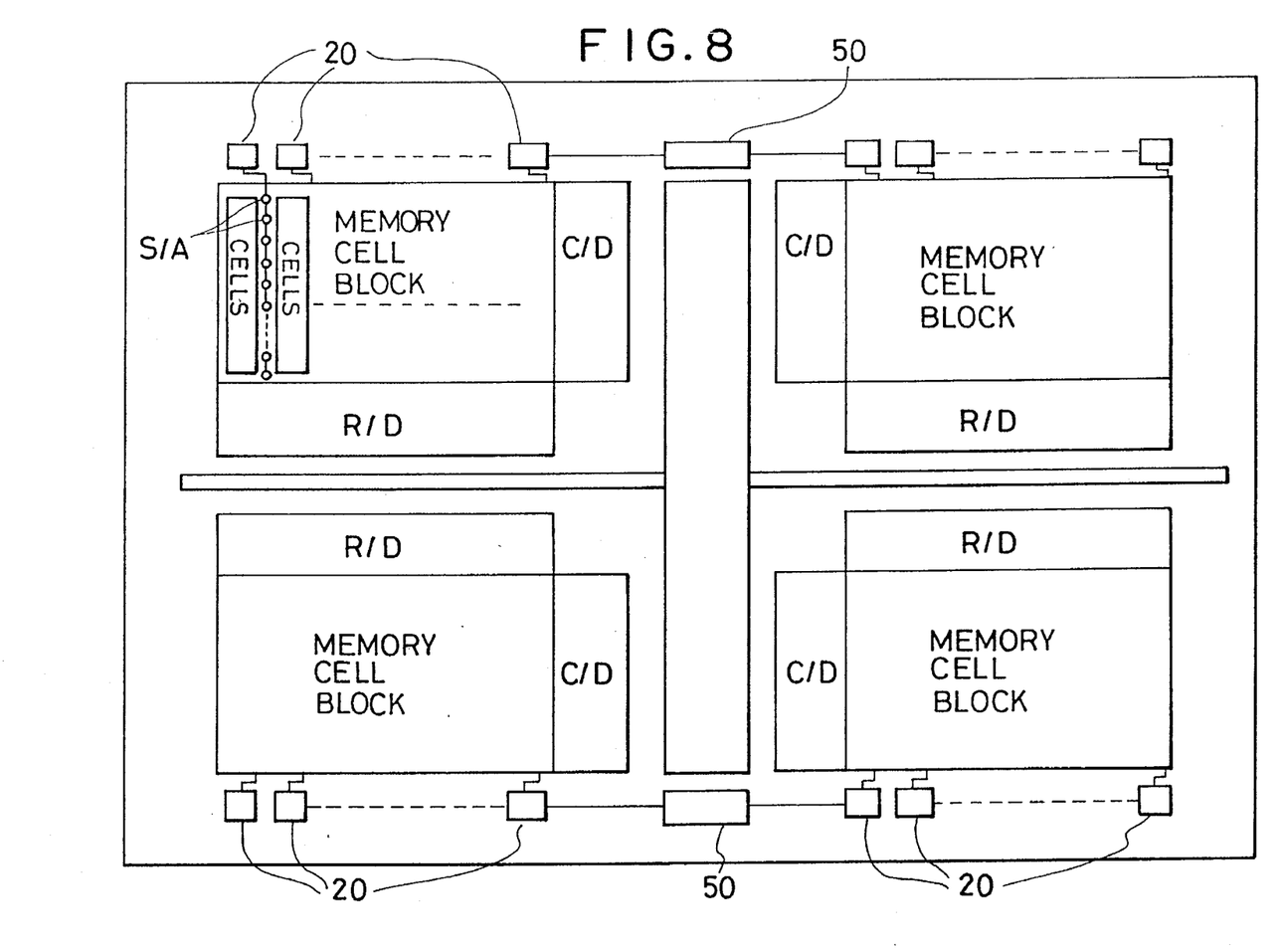
FIG. 8 is a general view of a basic configuration of a semiconductor integrated circuit including the sense amplifier control circuit consisting of the standard voltage generating circuit 50 shown in FIG. 5 and the drive circuit 20 shown in FIG. 6.

FIG. 8 is a general view of a basic configuration of a semiconductor integrated circuit including four memory cell blocks, a sense amplifier control circuit consisting of the standard voltage generating circuit 50 shown in FIG. 5 and the drive circuit 20 (a drive means) shown in FIG. 6.

In the semiconductor integrated circuit shown in FIG. 8, a predetermined number of sense amplifiers are placed between adjacent memory cell groups. The charge ability of the sense amplifier is controlled by the sense amplifier control means 20 and 50, of which the operation has already been described above in detail.

In FIG. 8, the semiconductor integrated memory device is a 4M type memory device, each memory cell block is a 256K bytes memory block. The sense amplifier control circuits 20 and 50 are located on outside of each memory cell block.

SECOND EMBODIMENT

Figure 9:
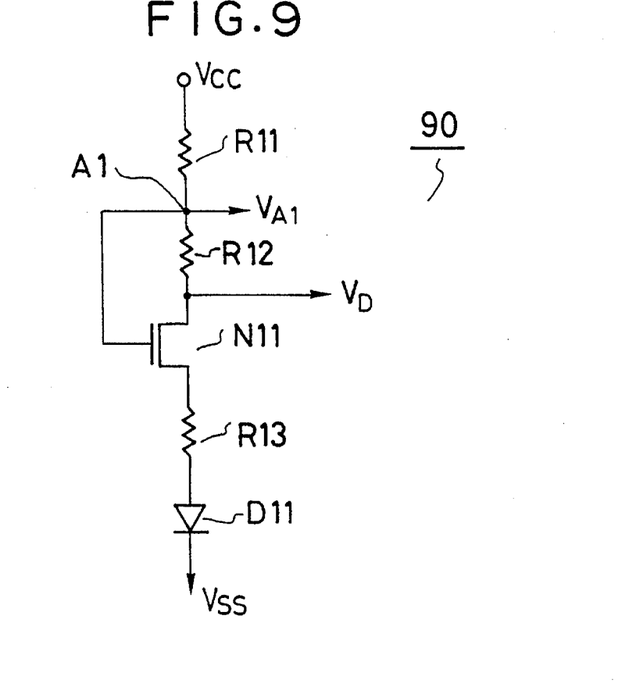
FIG. 9 is a circuit diagram of a standard voltage generating circuit in a sense amplifier control circuit for a sense amplifier as a second embodiment of a semiconductor integrated circuit of the present invention.

FIG. 9 is a circuit diagram of a standard voltage generating circuit 90 of a semiconductor integrated circuit as a second embodiment according to the present invention.

The standard voltage generating circuit 90 shown in FIG. 9 is connected to the drive circuit 20 in the sense amplifier control circuit 60 shown in FIG. 6 for a sense amplifier shown in FIG. 6.

The drive circuit 20 is made up of a current mirror circuit, for example. The drive circuit 20 in the sense amplifier control circuit 60 for a sense amplifier generates a sense amplifier drive signal φP for driving the source of the P-channel MOS transistors P33 and P34 in the sense amplifier 40 illustrated in FIG. 3.

In FIG. 9, the standard voltage generating circuit 90 of the second embodiment comprises resistances R11 and R12, and R13, an N-channel MOS transistor N11, and a diode D11.

The resistance R12 is inserted in series with the resistance R11, one end of which is connected to the source voltage $V_{CC}$. The drain of the N-channel MOS transistor N11 is connected to the other end of the resistance R12 and the resistance R13 is connected to the source of the N-channel MOS transistor N11.

The anode of the diode D 11 is connected to the other end of the resistance R13, and the cathode of the diode D11 is connected to the ground potential $V_{SS}$. The point at which the resistance R12 is connected to the resistance R11 is connected to the gate of the N-channel MOS transistor N11. The standard voltage $V_D$ which is the output of the standard voltage generating circuit 90, is provided from the drain of the N-channel MOS transistor N11.

Figure 10:
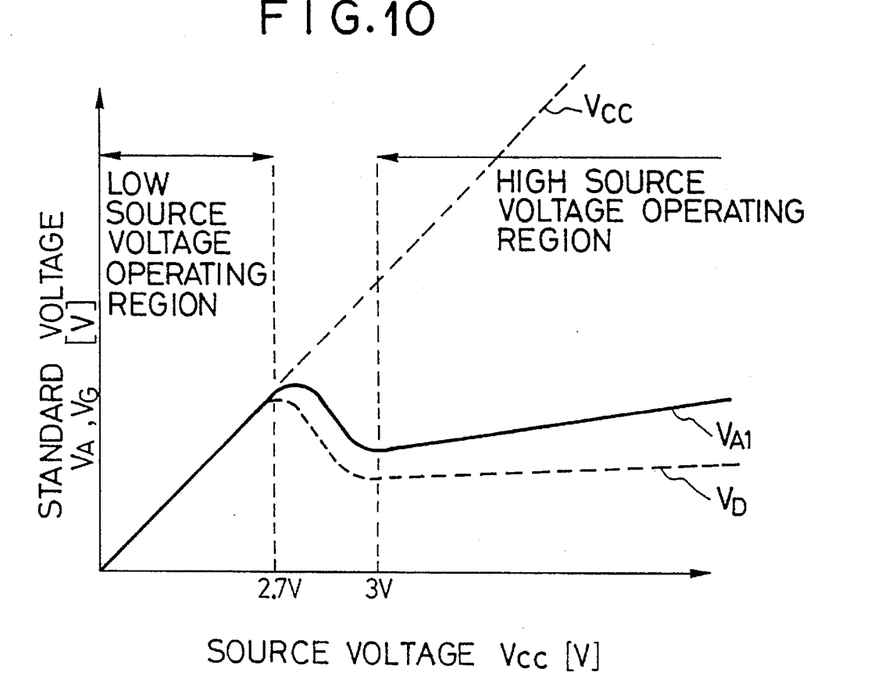
FIG. 10 is a diagram showing the characteristics of a standard voltage $V_D$ with respect to a source voltage $V_{CC}$ and for a potential $V_{A1}$ at the point of connection of a resistance R11 and a resistance R12 for the second embodiment of the standard voltage generating circuit 90 shown in FIG. 9.

The standard voltage $V_D$ corresponding to the source voltage $V_{CC}$ in the standard voltage generating circuit 90, and the characteristics of the potential $V_{A1}$ at the point at which the resistance R12 is connected to the resistance R11 are shown in FIG. 10.

First, in the case where the gate voltage $V_{A1}$ of the N-channel MOS transistor N11 is lower than the threshold voltage of the N-channel MOS transistor N11, namely in the low source voltage operating region, the N-channel MOS transistor N11 is cut off, so that a value almost the same as the source voltage $V_{CC}$ is obtained for the standard voltage $V_D$.

As the source voltage $V_{CC}$ becomes high, and when the gate voltage $V_{A1}$ of the N-channel MOS transistor N11 is higher than the threshold voltage of the N-channel MOS transistor N11, the N-channel MOS transistor N11 gradually turns ON. In this boundary region, the conductance of the N-channel MOS transistor N11 gradually increases (the resistance becomes small). The standard voltage $V_D$ at this time is determined by the ratio of the resistance component of the N-channel MOS transistor N11 to the resistances R11, R12, and R13, and the threshold voltage of the diode D11, therefore characteristics are demonstrated whereby the source voltage $V_{CC}$ increases until the N-channel MOS transistor N11 is completely ON, and the standard voltage $V_D$ decreases as the source voltage $V_{CC}$ rises.

On the side where the source voltage $V_{CC}$ is high, if a value obtained at which the ON state of the N-channel MOS transistor N11 can be ignored with respect to the resistances R11, R12, and R13 because the N-channel MOS transistor N11 reaches the completely ON state, then the standard voltage $V_D$ is determined according to the ratio of the resistance R13 to the resistances (R11+R12) and the threshold voltage of the diode D11.

Accordingly, on the high source voltage operating region, the standard voltage $V_D$ demonstrates characteristics wherein it slightly increases together with the source voltage $V_{CC}$ according to the above-mentioned divided voltage ratio (varies with the resistance ratio). As one of the features of the standard voltage generating circuit 90 of the second embodiment, it is possible to easily shift the switching point between the low source voltage operating region and the high source voltage operating region by changing the ratio of the resistance R12 to the resistance R11.

For example, by setting the resistance R11 high with respect to the resistance R12, the switching point can be shifted to the high voltage side.

As outlined above, in the present embodiment, almost the same value is obtained for the standard voltage $V_D$ as the source voltage $V_{CC}$ on the side where the source voltage $V_{CC}$ is low. In addition, at a voltage even higher than the desired voltage, the standard voltage $V_D$ is held to a low level in comparison with the low source voltage operating region. Specifically, there are two characteristics corresponding to the value of the source voltage $V_{CC}$.

Specifically, when the source voltage $V_{CC}$ is in the low voltage side, because the standard voltage $V_D$ of the drive circuit 20 for the P-channel sense amplifier 40 is high, the charging velocity of the P-channel sense amplifier 40 (a charge supplying circuit) therefore shows an increasing tendency, and the charging velocity of the P-channel sense amplifier 40 is retarded to a remarkable degree on the low source voltage operating region. In a dynamic RAM (DRAM), for example, the cycle time is reduced by reducing the cell data restoration time.

When the source voltage $V_{CC}$ is in the high source voltage operating region, the charging velocity of the P-channel sense amplifier 40 is suppressed, and, in particular, it is possible to reduce erroneous operation and the like resulting from charging noise, which becomes a major problem on the high voltage side.

Also, with respect to the problem of a point of non-continuity when switching between the low voltage side and the high voltage side, the standard voltage $V_D$ does not change steeply, and because the change is actually gradual, it reaches a level where the effect on the operation can be ignored.

As outlined in the foregoing detailed explanations, in the present invention, the charging ability of the sense amplifier (or a charge supplying circuit) is to be optimized, particularly when an external source voltage for the same integrated circuit varies, and characteristics which change during the low source voltage and during the high source voltage are provided as the standard voltage in the control means which drives the sense amplifier. When the source voltage is low, the charging ability of the sense amplifier is high, and therefore operates in the direction where a delay in cycle timing can be restrained. Conversely, the charging ability of the sense amplifier is restrained with the high source voltage, and erroneous operation from charging noise is inhibited so that it is possible to provide a semiconductor integrated circuit wherein a lowering of the operating margin is prevented by charging the sense amplifier.

In addition, at close to the point of switching from low source voltage to high source voltage, in practice, the standard voltage of the control means switches gradually so that no point of non-continuity is seen in the characteristics. It is thus possible to prevent the generation of switching noise close to the switching point, and to prevent abrupt changes in the access time.

What is claimed is:

1. A semiconductor integrated circuit comprising:

a plurality of memory cell blocks, each memory cell block comprising a plurality of memory cells arranged in rows and columns;

a plurality of sense amplifiers, each sense amplifier located adjacent to the plurality of memory cells; and a plurality of sense amplifier control circuits, each sense amplifier control circuit being located outside of the plurality of memory cell blocks, each sense amplifier control circuit comprising:

a standard voltage generating circuit that provides a standard voltage, the standard voltage generating circuit comprising:

a first circuit comprising a first resistance, a N-channel MOS transistor, a second resistance, and a diode being connected in series, the first resistance being connected to a power source and the diode being connected to ground; and a second circuit comprising a P-channel MOS transistor, a third resistance, and a fourth resistance being connected in series, the P-channel MOS transistor being connected to the power source, the fourth resistance being connected to ground, and a connection point between the P-channel MOS transistor and the third resistance being connected to a gate of the P-channel MOS transistor, wherein a connection point between the third resistance and the fourth resistance is connected to a gate of the N-channel MOS transistor, and an output of the standard voltage generating circuit is generated from a connection point between the first resistance and the N-channel MOS transistor, and a control circuit for receiving the standard voltage provided from the standard voltage generating circuit and for generating a driver signal to a sense amplifier to control the charging ability of the sense amplifier, wherein the power source has first, intermediate, and second voltage regions, in the first voltage region, the potential of the standard voltage increases with an increase of the power source, in the intermediate voltage region, the potential of the standard voltage changes opposite to a change of the power source, and in the second voltage region, the potential of the standard voltage increases with an increase of the power source.

2. A semiconductor integrated circuit comprising:

a plurality of memory cell blocks, each memory cell block comprising a plurality of memory cells arranged in rows and columns;

a plurality of sense amplifiers, each sense amplifier located adjacent to the plurality of memory cells; and a plurality of sense amplifier control circuits, each sense amplifier control circuit being located outside of the plurality of memory cell blocks, each sense amplifier control circuit comprising:

a standard voltage generating circuit coupled to a source voltage and ground that provides a standard voltage, the standard voltage generating circuits including a first resistance, a second resistance, a N-channel MOS transistor, a third resistance, and a diode being connected in series, wherein a connection point between the first resistance and the second resistance is connected to a gate of the N-channel MOS transistor, and an output of the standard voltage generating circuit is generated from a connection point between the second resistance and the N-channel MOS transistor, and a control circuit for receiving the standard voltage provided from the standard voltage generating circuit and for generating a driver signal to a sense amplifier to control the charging ability of the sense amplifier, wherein the source voltage, which controls the potential of the driver signal, has first, intermediate, and second voltage regions, in the first voltage region, the potential of the standard voltage increases with an increase of the source voltage, in the intermediate voltage region, the potential of the standard voltage changes opposite to a change of the source voltage, and in the second voltage region, the potential of the standard voltage increases with an increase of the source voltage.

3. A semiconductor integrated circuit as claimed in claim 1, wherein the control circuit includes a current mirror circuit.

4. A semiconductor integrated circuit as claimed in claim 2, wherein the control circuit includes a current mirror circuit.

5. A semiconductor integrated circuit as claimed in claim 1, wherein the range of the intermediate voltage region is from about 2.7 volt to about 3 volt.

6. A semiconductor integrated circuit as claimed in claim 2, wherein the range of the intermediate voltage region is from about 2.7 volt to about 3 volt.

7. A semiconductor integrated circuit as claimed in claim 1, wherein the number of the memory cell blocks is four.

8. A semiconductor integrated circuit as claimed in claim 2, wherein the number of the memory cell blocks is four.

9. A semiconductor integrated circuit as claimed in claim 1, wherein each memory cell of the plurality of memory cells is coupled to a corresponding sense amplifier.

10. A semiconductor integrated circuit as claimed in claim 2, wherein each memory cell of the plurality of memory cells is coupled to a corresponding sense amplifier.

11. A semiconductor integrated circuit as claimed in claim 1, wherein a row decoder is incorporated between adjacent memory cell blocks, and the sense amplifier control circuits are incorporated outside of each memory cell block and on an end opposite to each row decoder.

12. A semiconductor integrated circuit as claimed in claim 2, wherein a row decoder is incorporated between adjacent memory cell blocks, and the sense amplifier control circuits are incorporated outside of each memory cell block and on an end opposite to each row decoder.

13. A semiconductor integrated circuit as claimed in claim 1, wherein each of the sense amplifier control circuits is incorporated corresponding to each column of the plurality of memory cells.

14. A semiconductor integrated circuit as claimed in claim 2, wherein each of the sense amplifier control circuits is incorporated corresponding to each column of the plurality of memory cells.

15. A semiconductor integrated circuit comprising:

a plurality of memory cell blocks, each memory cell block comprising a plurality of memory cells arranged in rows and columns;

a plurality of sense amplifier means, each sense amplifier means located adjacent to the memory cells, and a plurality of sense amplifier control means, each sense amplifier control means being located outside of the plurality of memory cell blocks, each sense amplifier control means comprising:

standard voltage generating means coupled to a source voltage and ground for generating a standard voltage; and control means for receiving the standard voltage provided from the standard voltage generating means and for generating a driver signal to a sense amplifier to control the charging ability of the sense amplifier, wherein the source voltage, which controls the potential of the driver signal, has first, intermediate, and second voltage regions, in the first voltage region, the potential of the standard voltage increases with an increase of the source voltage, in the intermediate voltage region, the potential of the standard voltage is changed opposite to a change of the source voltage, and in the second voltage region, the potential of the standard voltage increases with the increase of the source voltage.

16. A semiconductor integrated circuit comprising:

a memory cell array comprising a plurality of memory cells arranged in rows and columns;

a plurality of bit line pairs coupled to said plurality of memory cells;

a plurality of sense amplifiers, each sense amplifier having a pair of p-channel transistors connected in series between one of said plurality of bit line pairs;

a plurality of driver circuits, each driver circuit having,
first and second transistors, said transistors having p-channels and gates coupled to each other and sources connected to a source voltage, a drain of said first transistor being connected to a connection point between said pair of p-channel transistors of said plurality of sense amplifiers, a drain of said second transistor coupled to the gates of said first and second transistors;

a third transistor connected between said source voltage and the gates of said first and second transistors, a control signal being applied to the gate of said third transistor to turn on or off said first and second transistors;

a fourth transistor operable with a standard voltage, having an n-channel and connected between ground and the gates of said first and second transistors, the standard voltage being applied to said fourth transistor to control current passing through said first and second transistors; and a plurality of voltage generators connected to a corresponding one of said plurality of driver circuits for supplying said standard voltage to said plurality of driver circuits, each voltage generator having a characteristic that said standard voltage decreases as said source voltage increases.

17. A semiconductor integrated circuit as claimed in claim 16, wherein each voltage generator comprises:

a fifth transistor, having a gate, a source and a drain coupled to the gate, connected to said source voltage;

a first resistor connected in series to said fifth transistor;

a second resistor connected to said first resistor and ground a second resistor connected to said source voltage;

a six transistor having an n-channel and a gate connected to a node between said first resistor and said second resistor; and a diode connected to ground in a forward direction, in which said third resistor, said sixth transistor and said diode are connected in series between said source voltage and ground to generate said standard voltage at a node between said sixth transistor and said third resistor.

18. A semiconductor integrated circuit as claimed in claim 16, wherein each of said voltage generators comprises:

a first resistor connected to said source voltage;

a second resistor connected in series to said first resistor;

a diode connected to ground;

a fifth transistor, having an n-channel and being connected between said second resistor and said diode with said first and second resistors and said diode in series, said fifth transistor having a gate coupled to a node in between said first and second resistors to generate said standard voltage at said node.

19. A semiconductor integrated circuit as claimed in claim 16, wherein said source voltage includes a low source voltage region, an intermediate source voltage region and a high source voltage region, in which, as said source voltage increases, said standard voltage increases in the low source voltage region, decreases in the intermediate source voltage region and increases in the high source voltage region.

20. A semiconductor integrated circuit as claimed in claim 16, further comprising a plurality of row decoders located at an end opposite to said driver circuits with said memory cells positioned in between.

21. A semiconductor integrated circuit operable with a sense amplifier, a first power source and a second power source, the integrated circuit comprising:

a driver circuit having, a first field effect transistor operable with a control signal;

a second field effect transistor, operable with a reference voltage, connected between the first field effect transistor and the second power source;

a third field effect transistor connected between the first power source and the first field effect transistor;

a fourth field effect transistor, that provides an output signal to the sense amplifier, connected between the first power source and the first field effect transistor, wherein the gates of the third field effect transistor and the fourth field effect transistor are connected together and further connected to at where the first field effect transistor and the third field effect transistor is connected; and a voltage generating circuit for providing the reference voltage to the second field effect transistor, the voltage generating circuit including, a first resistor having a first and a second ends;

a fifth field effect transistor connected between the first power source and the first end of the first resistor, wherein a drain and a gate of the fifth field effect transistor are coupled together;

a second resistor connected in series between the second end of the first resistor and the second power source;

a sixth field effect transistor, wherein a gate of the sixth field effect transistor is connected to the second end of the first resistor;

a third resistor connected between the first power source and the sixth field effect transistor, wherein the reference voltage is outputted from a node at which the third resistor and the sixth field effect transistor are connected;

a diode connected to the second power source; and a fourth resistor connected in series between the diode and the sixth field effect transistor.

22. A semiconductor integrated circuit operable with a sense amplifier, a first power source and a second power source, the integrated circuit comprising:

a driver circuit having, a first field effect transistor operable with a control signal;

a second field effect transistor, operable with a reference voltage, connected between the first field effect transistor and the second power source;

a third field effect transistor connected between the first power source and the first field effect transistor;

a fourth field effect transistor, that provides an output signal to the sense amplifier, connected between the first power source and the first field effect transistor, wherein the gates of the third field effect transistor and the fourth field effect transistor are connected together and further connected to at where the first field effect transistor and the third field effect transistor is connected; and a voltage generating circuit for providing the reference voltage to the second field effect transistor, the voltage generating circuit including, first resistor having a first and second ends;

a second resistor connected in series between the first power source and the first end of the first resistor;

a diode connected to the second power source;

a fifth field effect transistor interposed between the diode and the second end of first resistor, wherein a gate of the fifth field effect transistor is coupled to a node at which the first resistor and the second resistor are connected, and the reference voltage is outputted from a node at which the second ends of said first resistor and the fifth field effect transistor are connected; and a third resistor connected in series between the fifth field effect transistor and the diode.

* * * * *